(12) United States Patent
Chen et al.

(10) Patent No.: US 8,581,374 B1
(45) Date of Patent: Nov. 12, 2013

(54) PLACING HEAT SINK INTO PACKAGING BY STRIP FORMATION ASSEMBLY

(75) Inventors: Chender Chen, Fongyuan (TW); Chenglin Liu, San Jose, CA (US); Shiann-Ming Liou, Campbell, CA (US)

(73) Assignee: Marvell International Ltd., Hamilton (BM)

( * ) Notice: Subject to any disclaimer, the term of this patent is extended or adjusted under 35 U.S.C. 154(b) by 6 days.

(21) Appl. No.: 13/247,857

(22) Filed: Sep. 28, 2011

Related U.S. Application Data

(60) Provisional application No. 61/389,409, filed on Oct. 4, 2010, provisional application No. 61/392,816, filed on Oct. 13, 2010.

(51) Int. Cl.
*H01L 23/495* (2006.01)
*H01L 23/28* (2006.01)

(52) U.S. Cl.
USPC .... 257/675; 257/706; 257/796; 257/E33.075; 257/E23.051

(58) Field of Classification Search
USPC ......... 257/796, 276, 625, 675, 707, 712–722, 257/E33.075, E31.131, E23.051, 257/E23.08–E23.131
See application file for complete search history.

(56) References Cited

U.S. PATENT DOCUMENTS 6,288,900 B1 * 9/2001 Johnson et al. ............... 361/705
6,469,380 B2 * 10/2002 Sorimachi et al. ........... 257/706
6,844,622 B2 * 1/2005 Huang et al. .................. 257/706

* cited by examiner

*Primary Examiner* — Jasmine Clark

(57) ABSTRACT

Embodiments of the present disclosure describe semiconductor device packaging techniques and devices that incorporate a heat spreader into the insulating material of a packaged semiconductor device. In one embodiment, a device comprising a semiconductor device is coupled to a substrate, and insulating material covers (i) a portion of the semiconductor device and (ii) a portion of the substrate. The device also comprises a heat spreader embedded in the insulating material and the heat spreader is isolated from the substrate at least in part by the insulating material.

19 Claims, 7 Drawing Sheets

PLACING HEAT SINK INTO PACKAGING BY STRIP FORMATION ASSEMBLY

CROSS REFERENCE TO RELATED APPLICATIONS

This disclosure claims priority to U.S. Provisional Patent Application No. 61/389,409, filed Oct. 4, 2010, and U.S. Provisional Patent Application No. 61/392,816, filed Oct. 13, 2010, the entire specifications of which are hereby incorporated by reference in their entireties for all purposes, except for those sections, if any, that are inconsistent with this specification.

TECHNICAL FIELD

Embodiments of the present disclosure relate to the field of integrated circuits, and more particularly, to techniques, structures, and configurations of semiconductor chip packaging.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Thermal characteristics of packaged semiconductor devices have been a design issue with respect to device performance and reliability. However, controlling thermal characteristics of packaged devices has been problematic due to the lack of space available to implement thermal conductivity solutions in an efficient manner. One conventional technique for controlling the thermal characteristics in Plastic Grid Ball Array (PBGA) packages includes implementing a heat spreading structure by securing a piece of metal to the lead frame to draw heat away from the device at a higher rate than the rate provided by the package molding. Unfortunately, most packaging schemes cannot accommodate such a design.

SUMMARY

This disclosure relates to a device comprising a substrate and a semiconductor device coupled to the substrate. The device also includes insulating material covering (i) a portion of the semiconductor device and (ii) a portion of the substrate. A metal component is also embedded in the insulating material and the metal component is isolated from the substrate at least in part by the insulating material.

This disclosure also relates to another device comprising a substrate and a semiconductor device coupled to the substrate. The device also includes insulating material that is substantially encapsulating the semiconductor device and is in physical contact with the substrate. Further, a metal component is coupled to the planar surface of the insulating material, but the metal component is isolated from the substrate at least in part by the insulating material.

This disclosure also describes a method for building a packaged semiconductor device. The method comprising placing a plastic film in a compression mold and aligning a metal film over the plastic film. Next, a molding compound is dispersed over the metal film. Then, a lead frame assembly is aligned over the metal film and the lead frame assembly comprises a plurality of semiconductor devices. The semiconductor devices are compressed into the molding compound to (i) embed the metal film into the molding compound, and to (ii) prevent physical contact between the metal film and the lead frame.

This Brief Summary is provided to introduce simplified concepts relating to techniques for embedding a metal layer into a molded package for semiconductor devices, which are further described below in the Detailed Description. This Summary is not intended to identify essential features of the claimed subject matter, nor is it intended for use in determining the scope of the claimed subject matter.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

FIGS. 1A-1F illustrate top views and cross sectional views of a packaged wire bonded device 100, and two packaged flip-chip devices 102, 104 that have heat spreaders embedded in the molded portion of their packaging.

Figure 1A:
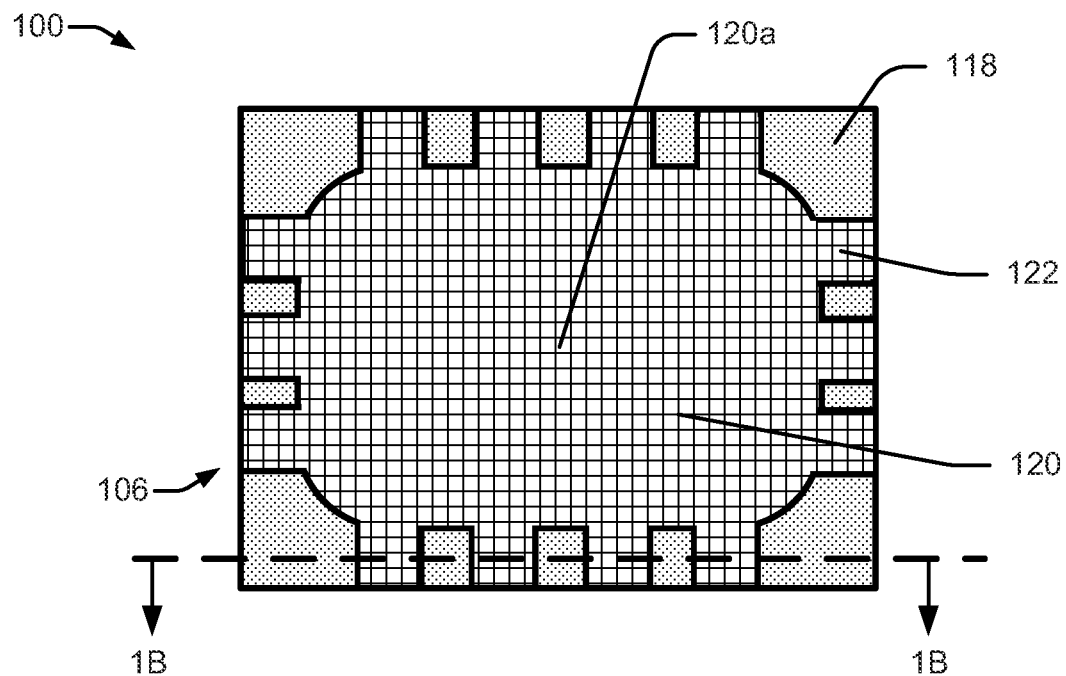
FIGS. 1A-1F illustrate top views and cross sectional views of example packaging arrangements that include an embedded heat spreader.
Figure 1B:
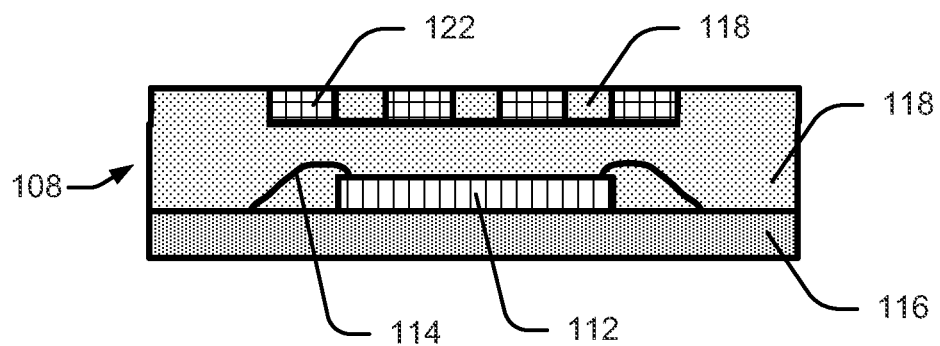

The packaged wire bonded device 100 is illustrated in top view in FIG. 1A and cross sectional view in FIG. 1B per cross section line 1B-1B of FIG. 1A. The packaged wire bonded device 100 includes a semiconductor device 112 that is wire bonded 114 to a substrate 116 or lead frame. The packaged wire bonded device 100 also includes molded insulating material 118, and a heat spreader 120 embedded in the molded insulating material 118. As can be seen in the top view of FIG. 1A, the heat spreader 120 covers a significant portion of the top surface of packaged wire bonded device 100, and (on one implementation) is arranged to have fingers 122 that protrude to the edge of the device 100. In one implementation, the fingers 122 increase the rigidity of the packaged wire bonded device 100 to minimize warping of the package and to more firmly secure the main portion 120a of the heat spreader 120 to the insulating material 118. As illustrated in the cross section view of FIG. 1B, the thickness of the main portion 120a and the fingers 122 of the heat spreader 120 have a uniform thickness. In alternative embodiments, the thickness of the fingers 122 and the main portion 120a of the heat spreader 120 may vary in thickness and are not required to be uniform.

The heat spreader 120 is made of any material that has a higher thermal conductivity than the insulating material 118 covering the semiconductor device 112. In this way, the heat spreader 120 can draw heat away from the device 112 at a faster rate than if the semiconductor device 112 is encapsulated only by insulating material 118. By way of example and not limitation, the heat spreader 120 can be comprised of copper, copper alloy, aluminum. In alternative embodiments, the heat spreader 120 may also include a film layer (not illustrated) on a top surface of the heat spreader 120. The film layer can include Nickel or Chromium. Further, a bottom surface (not illustrated) of the heat spreader 120, which is in contact with the insulating material 118, may also have a layer of Cupric Oxide, Nickel, or Chromium.

For purposes of explanation and not limitation, the heat spreader 120 may be incorporated into a variety of Ball Grid Array (BGA) packing schemes (not illustrated). Such as, Thin & Fine Pitch BGA (TFBGA), molded Flip-Chip Chip Scale Package (FCCSP), Quad Flat No Leads (QFN), and Multi-Row QFN (MRQFN). The heat spreader 120 can be incorporated into any type of semiconductor packaging that uses insulating material 118 to protect semiconductor devices.

The insulating material 118 can be any epoxy or resin that can protect the semiconductor device 112 from light, heat, humidity, dust, physical impact, and static charge. Generally, the insulating material 118 will have a lower thermal conductivity than the heat spreader 120.

Figure 1C:
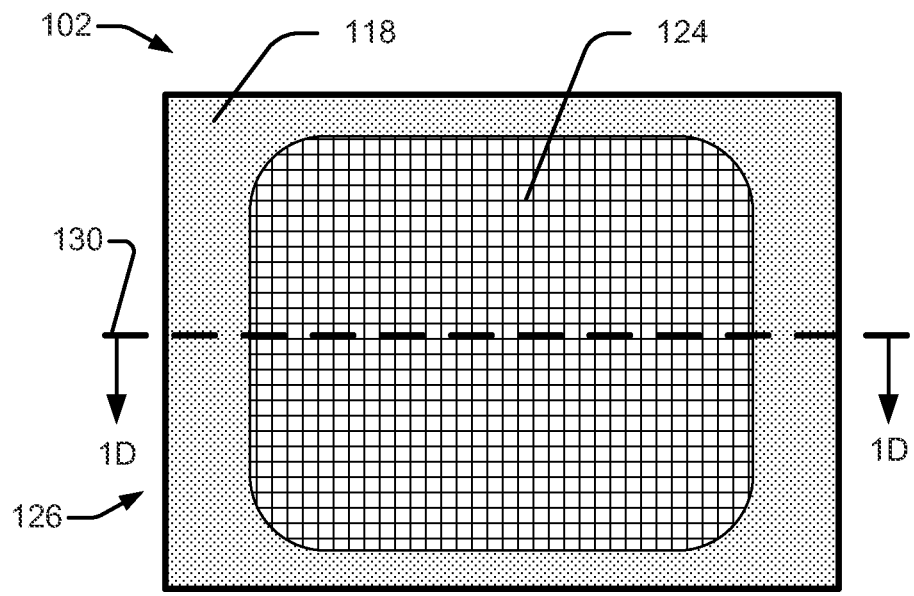
Figure 1D:
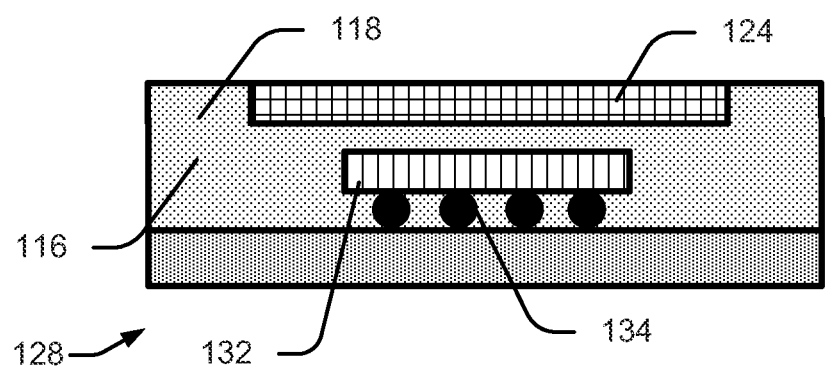

In another embodiment, a packaged flip chip device 102 may also incorporate a heat spreader 124 as illustrated in top view in FIG. 1C and the cross section view of FIG. 1D (per cross section line 1D-1D of FIG. 1C). The packaged flip chip device 102 also includes a semiconductor device 132 secured to a substrate 116 via ball joints 134. In this embodiment, the heat spreader 124 is arranged into a half etched configuration that has chamfered or rounded edges that secure the heat spreader to the insulating material 118 and to reduce stress in the heat spreader 124. The heat spreader 124 is of uniform thickness and the top surface of the hear spreader 124 is substantially flush with a top surface of the insulating material 118 as can been seen in FIG. 1D. In alternative embodiments (not illustrated), the heat spreader can cover all or nearly all of the top surface area of the insulating material 118 of flip chip device 102, such that none or nearly none of the insulating material 118 would be visible in the top view illustrated in FIG. 1C.

Figure 1E:
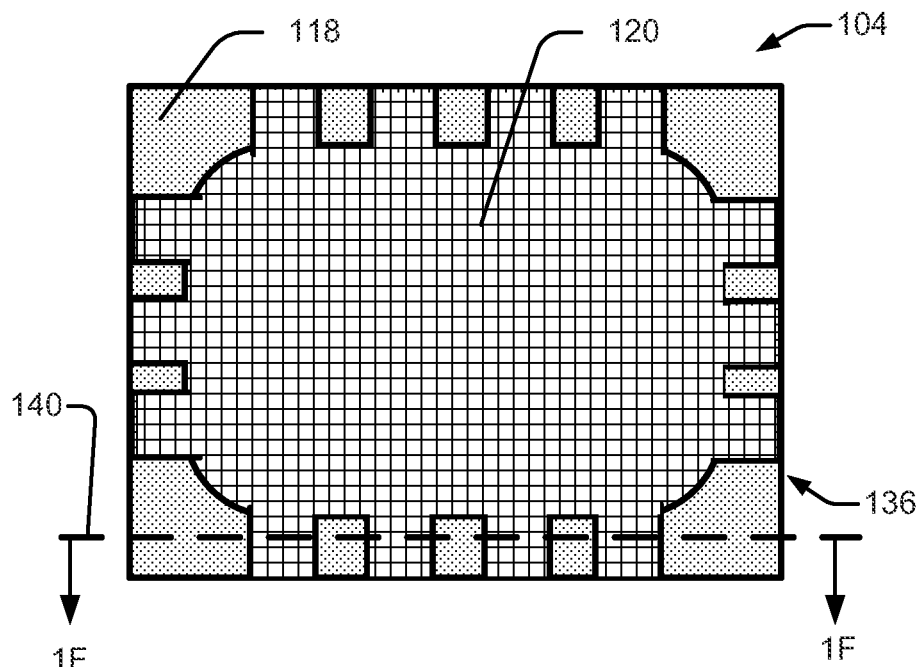
Figure 1F:
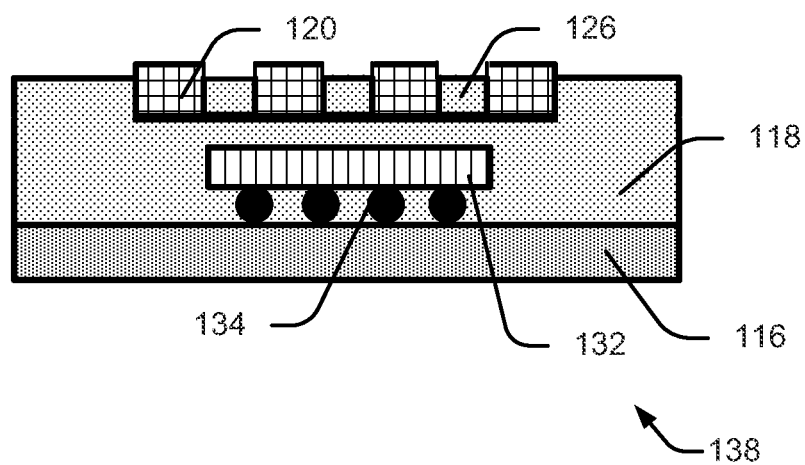

In yet another embodiment, as illustrated in FIGS. 1E and 1F, the heat spreader 126 can be incorporated into a packaged flip chip device 104 that includes a flip chip 132 bonded to a substrate 116 via ball joints 134. Although the design of the heat spreader 126 illustrated in FIGS. 1E and 1F is similar to the heat spreader 120 illustrated in FIGS. 1A and 1B, the heat spreader 126 is not flush with the insulating material 118. This is can be seen by way of comparison between the bottom view of FIG. 1F (per cross section line 1F-1F in FIG. 1E) and the cross sectional view of FIG. 1B. As illustrated, the thickness of the heater spreader 126 extends slightly above the insulating material 118. In an alternative embodiment (not illustrated), the thickness of the heat spreader 126 is recessed slightly below the insulating material.

Figure 2:
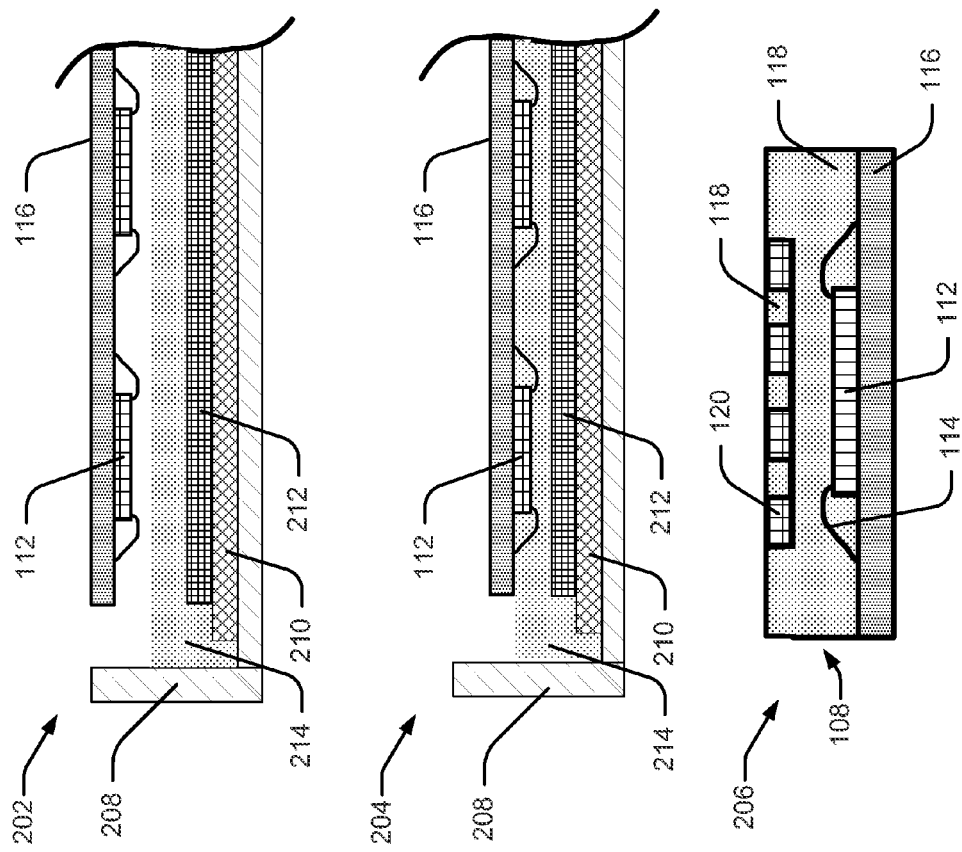
FIG. 2 is a process flow diagram of a method to embed a heat spreader into a semiconductor device package and includes representative illustrations of the process flow.
Figure 2:
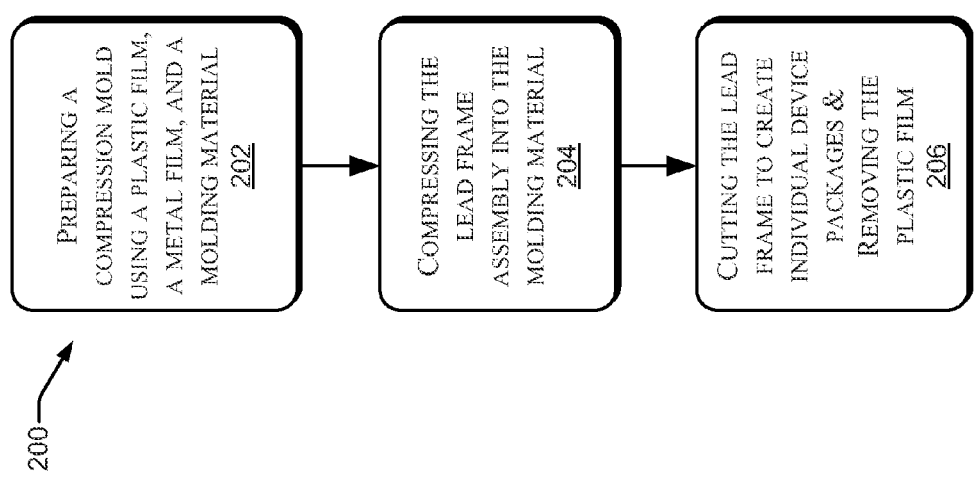

FIG. 2 includes a process flow diagram 200 and representative illustrations of the concepts described in the diagram 200. The diagram 200 generally pertains to a compression mold process to encapsulate or cover semiconductor devices with insulating material 118 that also includes an embedded heat spreader 120. The process flow diagram pertains to the embodiments described in FIGS. 1A-1F, but for the purpose of ease of explanation, only the embodiments of FIGS. 1A and 1B are illustrated in conjunction with FIG. 2.

At 202, a compression mold 208 is prepared or fitted with materials used to encapsulate the semiconductor devices 112 on a lead frame assembly 116. A plastic film 210 is placed at the base of the mold 208. A metal layer 212 is placed over the plastic film. The heat spreader 120 will be formed from the metal layer 212. The plastic film layer 210 minimizes mold flashing by creating a seal that prevents molding material 214 from reaching the surface of the metal layer 212 that is in contact with the plastic film 210 during the compression molding process. Next, the molding material 214 for the insulating material 118 is dispersed or poured into the compression mold 208 and over the metal layer 212 and the plastic film 210. Then, a lead frame assembly 116 is aligned over the metal layer 212. The mold 208 and its contents are heated and placed under vacuum to liquefy the molding material 214.

At 204, the lead frame assembly 116 is compressed into the molding material 214 enveloping or covering the semiconductor devices 112 and covering the surface of the lead frame assembly 116. After a period of time, the molding material 214 solidifies around the semiconductor devices 112 to form a semi-rigid insulating material 118 that also includes the embedded metal layer 212.

At 206, the lead frame assembly 116 is cut to produce individual devices 108 that are covered by insulating material 118. In this embodiment, the metal layer includes the pattern illustrated in device 100 of FIGS. 1A and 1B. Also, the plastic film 210 can be removed prior to or after the lead frame assembly 116 is cut into individual pieces.

Turning to the potential embodiments or configurations of the metal layer 212, FIGS. 3A-3D illustrate two examples of embodiments for the metal layer 212 described in the process flow diagram of FIG. 2.

Figure 3A:
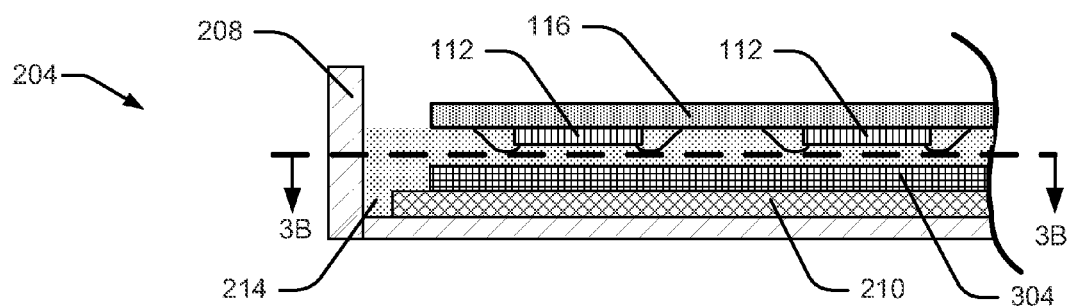
FIGS. 3A-3D illustrate various embodiments for metal structures that are embedded into packaging arrangements for semiconductor devices.

FIG. 3A illustrates a side view of one of the embodiments for a compression mold arrangement 204 as illustrated in FIG. 2. The arrangement 204 includes the compression mold 208, plastic film 210, metal layer 304, molding material 214, and the lead frame assembly 116 that includes semiconductor devices 112. Although only two devices are illustrated, many more devices may be attached to the lead frame 116 in the lateral and longitudinal directions. For example, the devices may form a two-dimensional array on the surface of the lead frame 116 which will be explained in FIG. 3B.

Figure 3B:
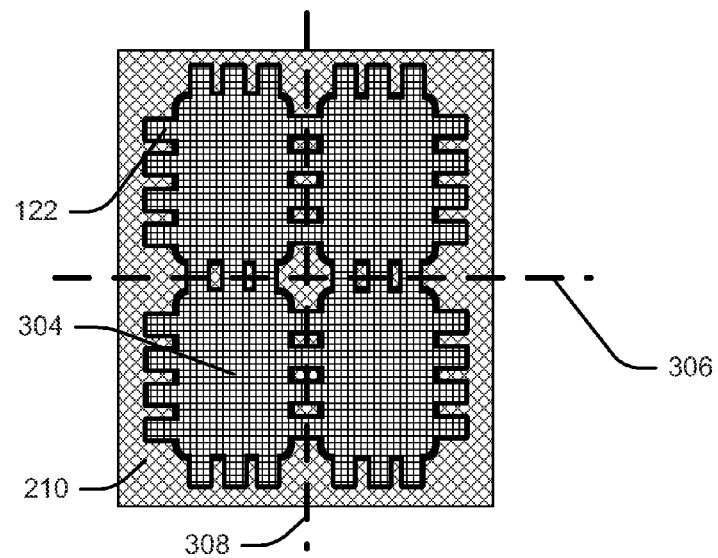

FIG. 3B is a top cross sectional view of the metal layer 304 and the plastic film 210 as seen along cross section line 3B-3B of FIG. 3A. The top view of FIG. 3B illustrates the plastic film 210 lying on the bottom of the compression mold 208 and corresponding metal layer 304 placed over the plastic film 210. In this embodiment, the devices 112 of the lead frame assembly 116 are aligned over each repeating element of the metal layer 304 to form a 2×2 array of devices, with each device being similar to the packaged wire bonded device 100 illustrated in FIG. 1. The four devices can be separated by cutting along cutting lines 306 and 308 to create four individually packaged wire bonded devices.

Figure 3C:
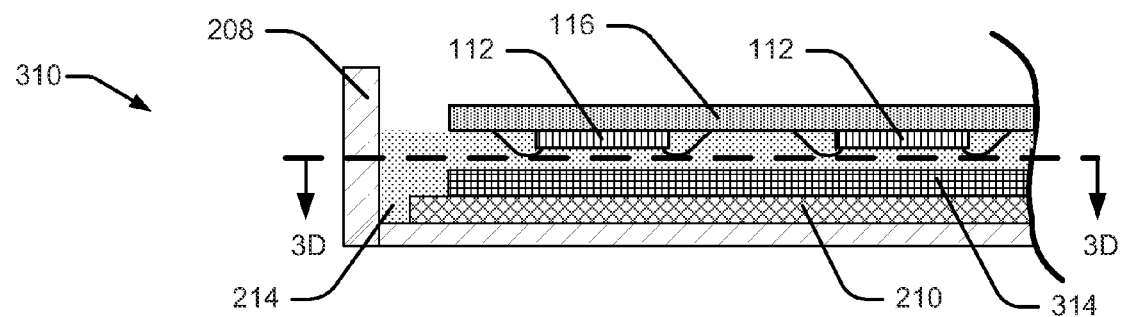

Similarly, FIG. 3C illustrates another compression mold arrangement 310 from a side view. The arrangement 310 includes the compression mold 208, plastic film 210, metal layer 314, base material 214, and the lead frame assembly 116 that includes semiconductor devices 112. Although only two devices are illustrated, many more devices may be attached to the lead frame 116 in the lateral and longitudinal directions.

Figure 3D:
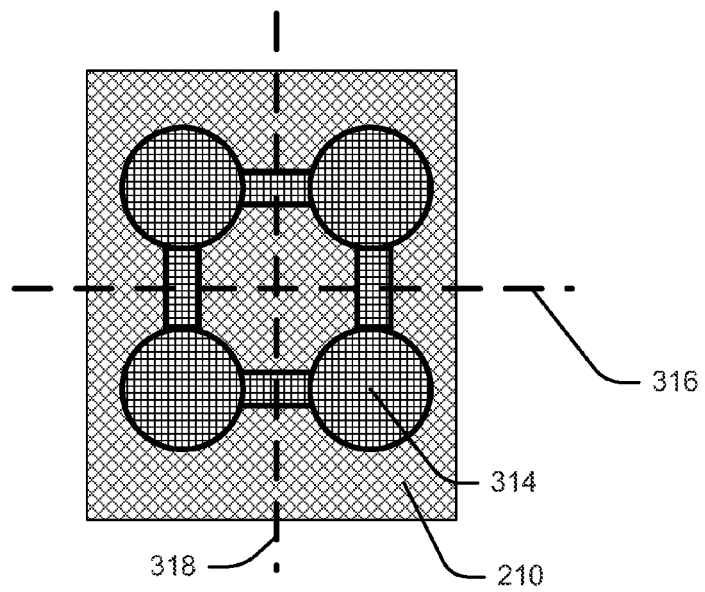

FIG. 3D is a top cross sectional view of compression mold arrangement 310 as seen from cross section line 3D-3D of FIG. 3C. In this embodiment, metal layer 314 is placed over plastic film 210 includes four circular forms that arranged in a 2×2 array, such that each semiconductor device 112 is aligned over each of the circular forms. In this embodiment 312 includes four devices that are aligned over the top of each of the circular objects illustrated in embodiment 312. Additionally, cutting lines 316 and 318 illustrate where the lead frame assembly 116 should be cut to generate four individual devices.

In other embodiments, the individual heat spreaders may vary in geometry, surface area, thickness and orientation which can depend on the size of the individual devices attached to the lead frame assembly and the heat conductivity requirements for each device. For instance, the heat spreaders can rectangular, square, triangular, or any other multi-sided shape. Further, any of the shapes may include fingers 122 as illustrated in embodiment 300 to help secure the heat spreader to the insulating material 118.

Figure 4:
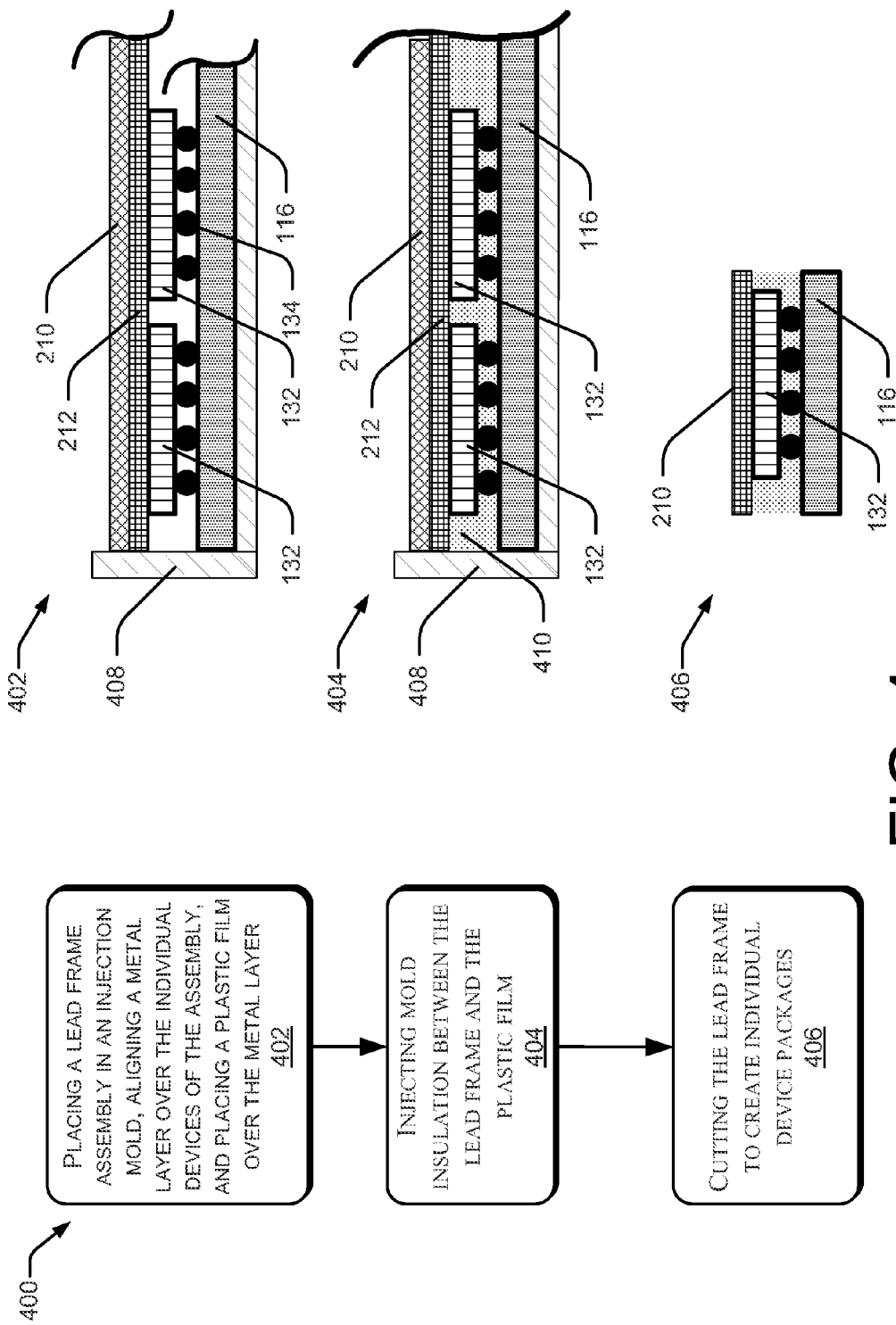
FIG. 4 is another process flow diagram of a method to embed a heat spreader into a semiconductor device package and includes representative illustrations of the process flow.

FIG. 4 illustrates a process flow diagram 400 and representative illustrations of a transfer molding process for incorporating heat spreaders into individual device packages.

At 402, a lead frame assembly that includes a plurality of devices 132 (e.g., flip chip devices) is placed in the transfer mold 408. Although only two devices are illustrated, the lead frame assembly 116 may include many more devices which can include a 2×2 array as illustrated in FIGS. 3A-3D. Also, a metal layer 212 is aligned over the arrayed devices such that each device will have its own heat spreader as illustrated in devices 102. A plastic film 210 is placed over the metal layer 212. As noted above, the metal layer is comprised of copper, copper alloy, aluminum, or any other metal. Also, the metal layer may include front side and back side films such as Nickel, Chromium, Cupric Oxide or a combination thereof. In an alternative embodiment (not illustrated), an under fill process is used for inserting insulating material 118 in the space between the ball joints 134 underneath the bottom of the devices 132. The underfill process can be completed prior to placing the metal layer 212 over the devices 132.

At 404, injecting the molding material 410 into the transfer mold 408. The insulating material 410 solidifies between the base of the lead frame and the metal layer 212.

At 406, following the solidification of the insulating material 410, the lead frame assembly can be cut to generate individual devices in the same way as described in FIG. 3.

The descriptions above may use perspective-based descriptions such as up/down, over/under, and/or top/bottom. Such descriptions are merely used to facilitate the discussion and are not intended to restrict the application of embodiments described herein to any particular orientation.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, integrated circuit, monolithic device, semiconductor device, die, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A device comprising:
   a substrate;
   a semiconductor device coupled to a surface of the substrate;
   an insulating material covering (i) a portion of the semiconductor device and (ii) a portion of the substrate, wherein the insulating material comprises a substantially planar surface; and
   a metal component embedded in the insulating material, wherein
      the metal component comprises a first surface that protrudes above the substantially planar surface of the insulating material, and
      the metal component is isolated from the substrate at least in part by the insulating material.

2. The device of claim 1, wherein the metal component is isolated from the substrate by having a lack of (i) physical connection and (ii) electrical connection with the substrate.

3. The device of claim 1, wherein:
   the substantially planar surface of the insulating material is (i) opposite to a substantially planar surface of the substrate and (ii) substantially parallel to the substantially planar surface of the substrate; and
   the metal component comprises
      a second surface that is (i) opposite to the first surface and (ii) below the substantially planar surface of the insulating material.

4. The device of claim 1, wherein the metal component comprises a copper alloy.

5. The device of claim 4, wherein:
   the first surface of the metal component comprises a layer of one of Nickel or Chromium;
   the metal component comprises a second surface that is opposite to the first surface; and
   the second surface comprises a layer of one of Cupric Oxide, Nickel or Chromium.

6. The device of claim 1, wherein the semiconductor device is coupled to the substrate at least in part by a plurality of wire bonds.

7. The device of claim 1, wherein the insulating material is formed using a compression molding process.

8. A device comprising:
   a substrate;
   a semiconductor device coupled to the substrate;
   an insulating material substantially encapsulating the semiconductor device, wherein,
      the insulating material is in physical contact with the substrate, and
      the insulating material comprises a substantially planar surface; and
   a metal component coupled to the substantially planar surface of the insulating material, wherein
      the metal component comprises a first surface that protrudes above the substantially planar surface of the insulating material, and
      the metal component is isolated from the substrate at least in part by the insulating material.

9. The device of claim 8, wherein the metal component is isolated from the substrate by having a lack of (i) physical connection and (ii) electrical connection with the substrate.

10. The device of claim 8, wherein:
the substantially planar surface of the insulating material is (i) opposite to a substantially planar surface of the substrate and (ii) substantially parallel to the substantially planar surface of the substrate; and
the metal component comprises
a second surface that is (i) opposite to the first surface and (ii) above the substantially planar surface of the insulating material.

11. The device of claim 8, wherein the metal component comprises a copper alloy.

12. The device of claim 11, wherein:
the first surface of the metal component comprises a layer of one of Nickel or Chromium;
the metal component comprises a second surface that is opposite to the first surface; and
the second surface comprises a layer of one of Cupric Oxide, Nickel or Chromium.

13. The device of claim 8, wherein the semiconductor device is coupled to the substrate at least in part by a plurality of metal spheres.

14. A lead frame assembly comprising:
a substrate;
a plurality of semiconductor devices coupled to a substantially planar surface of the substrate;
an insulating material substantially encapsulating each of the plurality of semiconductor devices, wherein
the insulating material is in physical contact with the substrate, and
the insulating material comprises a substantially planar surface that is (i) opposite to the substantially planar surface of the substrate and (ii) substantially parallel to the substantially planar surface of the substrate; and
a plurality of metal components coupled to the substantially planar surface of the insulating material, wherein
each metal component is associated with one of the plurality of semiconductor devices,
each metal component comprises a first surface that protrudes above the substantially planar surface of the insulating material and a second surface that is (i) opposite to the first surface and (ii) below the substantially planar surface of the insulating material, and
each metal component is isolated from the substrate at least in part by the insulating material.

15. The lead frame assembly of claim 14, wherein the plurality of semiconductor devices forms a two-dimensional array on the substrate.

16. The lead frame assembly of claim 14, wherein each metal component of the plurality of metal components is isolated from the substrate by having a lack of (i) physical connection and (ii) electrical connection with the substrate.

17. The lead frame assembly of claim 14, wherein each semiconductor device of the plurality of semiconductor devices is coupled to the substrate at least in part by a plurality of wire bonds.

18. The lead frame assembly of claim 14, wherein each semiconductor device of the plurality of semiconductor devices is coupled to the substrate at least in part by a plurality of metal spheres.

19. The lead frame assembly of claim 14, wherein:
the first surface of each metal component comprises a layer of one of Nickel or Chromium; and
the second surface of each metal component comprises a layer of one of Cupric Oxide, Nickel or Chromium.

* * * * *